(12) United States Patent
Charles et al.

(10) Patent No.: US 6,528,169 B2
(45) Date of Patent: Mar. 4, 2003

(54) NO-FLOW FLUX ADHESIVE COMPOSITIONS

(75) Inventors: Scott B. Charles, Hudson, WI (US); Robert J. Kinney, Woodbury, MN (US); Michael A. Kropp, Cottage Grove, MN (US); Roger A. Mader, Stillwater, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/888,921

(22) Filed: Jun. 25, 2001

(65) Prior Publication Data
US 2002/0032280 A1 Mar. 14, 2002

Related U.S. Application Data

(60) Provisional application No. 60/216,280, filed on Jul. 6, 2000.

(51) Int. Cl.[7] .......................... B32B 27/38; C09J 05/00; C08L 63/00; C08F 283/10
(52) U.S. Cl. .................. 428/414; 428/413; 156/330; 523/400; 525/523; 525/529; 525/530
(58) Field of Search .................. 428/413, 414; 156/295, 310, 330; 523/400; 525/108, 107, 523, 529, 530

(56) References Cited

U.S. PATENT DOCUMENTS

| | | | |
|---|---|---|---|
| 2,993,920 A | 7/1961 | Budde, Jr. et al. | |
| 3,052,650 A | 9/1962 | Wear et al. | 260/47 |
| 4,097,449 A * | 6/1978 | Heilman et al. | 523/444 |
| 5,128,746 A | 7/1992 | Pennisi et al. | 357/72 |
| 5,830,389 A | 11/1998 | Capote et al. | 252/512 |
| 5,851,311 A | 12/1998 | Diamant et al. | 148/23 |
| 5,985,043 A | 11/1999 | Zhou et al. | 148/24 |
| 5,985,456 A | 11/1999 | Zhou et al. | 428/414 |
| 6,103,549 A | 8/2000 | Master et al. | 438/106 |
| 6,235,846 B1 * | 5/2001 | Shalati et al. | 525/108 |
| 6,288,170 B1 | 9/2001 | Waid | 525/113 |

FOREIGN PATENT DOCUMENTS

| | | | |
|---|---|---|---|
| EP | 0 302 211 A2 | 6/1989 | |
| FR | 2 004 797 | 11/1969 | |
| WO | WO 97/07542 | 2/1997 | ......... H01L/23/488 |
| WO | WO 99/03597 | 1/1999 | |
| WO | WO 99/54372 | 10/1999 | ........... C08G/59/18 |

OTHER PUBLICATIONS

Patent Abstracts of Japan, Publication No. 05–020918, Publication Jan. 29, 1993.
Eddy et al., "A New One–Conponent Anhydride–Cured Epoxy with an Aliphatic Disiloxane Dianhydride and Metal–Coordinated Lewis Bases", *Journal of Polymer Science Part A: Polymer Chemistry*, Edition 28 (1990), No. 9, pp. 2417–2426, New York, NY.
Mader, U.S. application Ser. No. 09/454,558, entitled "Process for the Elimination of Materials Containing Hydrolyzable Halides and Other High Molecular Weight Materials from Epihalohydrin Derived Epoxy Resins", filed Dec. 7, 1999.
Anderson et al., U.S. application Ser. No. 09/611,450, entitled "Polyimide Hybrid Adhesives", filed Jul. 6, 2000.

* cited by examiner

*Primary Examiner*—Margaret G. Moore
*Assistant Examiner*—Michael J. Feely
(74) *Attorney, Agent, or Firm*—Scott A. Bardell; Dean M. Harts

(57) ABSTRACT

The invention provides adhesives and adhesive compositions that comprise epoxy resin and non-volatile anhydride. One embodiment further comprises a hydroxyl containing compound that is insoluble in the epoxy resin/anhydride blend at mixing temperatures which reacts with the anhydride at solder reflow temperatures to form a fluxing agent in-situ. Another embodiment further comprises catalyst.

27 Claims, No Drawings

NO-FLOW FLUX ADHESIVE COMPOSITIONS

CROSS REFERENCE TO RELATED APPLICATION

This application claims priority to U.S. Provisional Patent Application No. 60/216,280, filed Jul. 6, 2000.

FIELD OF THE INVENTION

The invention relates to adhesive compositions comprising epoxy resins and more particularly to such adhesive compositions used as underfill adhesives for integrated circuits.

BACKGROUND OF THE INVENTION

Early integrated circuit packaging involved wire bonding for connecting the integrated circuit to the printed circuit board. One alternative to wire bonding is solder bump interconnections. This method of interconnection is increasing in usage due to improved performance and increasing Input/Output (I/O) density. Flip chip bonding using solder bumped chips has allowed the use of area arrays on chips.

In flip chip bonding using solder bumped chips, a solder paste (flux) is applied to the circuit board, the chip pads are aligned with the traces on the substrate, and then the assembly is heated in a reflow oven. During this heating, the solder melts and a metallurgical bond between the chip and the substrate is formed. The surface tension of the solder during melting also leads to self-alignment of the pad pairs. After this reflow process, the solder flux must be washed away to remove corrosive residue. The assembly must be dried after this washing step.

The electronic assembly then requires additional environmental protection. In most cases, the underside of the assembly is encapsulated using an epoxy adhesive containing an inorganic filler. This adhesive is applied by allowing capillary forces to pull the resin underneath the chip. The filler, typically silica, is added to reduce the coefficient of thermal expansion of the underfill resin.

As chip sizes and the number of solder bumps on them increase, the method of adding an underfill material to the package using capillary forces will become less effective. An alternative to the capillary method of underfilling is to pre-apply, to the substrate, an adhesive that has fluxing properties. The adhesive, after fluxing the solder and allowing interconnection to occur, cures and becomes the underfill.

However, fluxing adhesives that contain liquid or easily volatilized anhydrides for example, provide bondlines that contain voids after cure. These voids can lead to premature solder fatigue failure in underfill applications. Fluxing adhesives that contain fluxing crosslinking agents can have poor shelf life or premature gelation or both, inhibiting solder flow.

SUMMARY OF THE INVENTION

In one aspect, the invention provides a one-part, thermally curable, adhesive composition comprising epoxy resin substantially free of hydroxyl functionality; anhydride curing agent, wherein the anhydride has a weight loss of less than 10 percent as determined by thermogravimetric analysis wherein the temperature is ramped from ambient to 140° C. at a rate of 90° C./minute, held isothermal for 1 minute, then ramped to a temperature of 225° C. at a rate of 90° C./minute and then held isothermal for 2 minutes; hydroxyl containing compound that is substantially insoluble in the epoxy resin at a temperature of less than 80° C.; and optionally, catalyst. A preferred use of the adhesive composition is as a fluxing adhesive composition.

In another aspect, the invention provides an electrical component assembly comprising an electrical component having a plurality of electrical terminations, each termination including a solder bump; a component carrying substrate having a plurality of electrical terminations corresponding to the terminations of the electrical component; and an adhesive disposed between and bonding the electrical component and the substrate together, the solder bumps being reflowed and electrically connecting the electrical component to the substrate, the adhesive comprising the reaction product of an adhesive composition of the invention.

In another aspect, the invention provides a method of bonding an electrical component assembly comprising the steps of providing an electrical component having a plurality of electrical terminations, each termination including a solder bump; providing a component carrying substrate having a plurality of electrical terminations corresponding to the terminations of the electrical component; providing a sufficient amount of an adhesive composition of the invention to bond the electrical component and the component carrying substrate together onto the substrate; contacting the electrical component with the adhesive composition; and curing the adhesive composition.

In yet another aspect, the invention provides a thermally-curable one-part adhesive composition comprising an epoxy resin substantially free of hydroxyl functionality and an anhydride curing agent. The adhesive compositions of this aspect are stable in that they are expected to have a relatively long shelf-life as compared to other epoxy resin/anhydride compositions. The adhesive compositions of this aspect have utility bonding substrates where a fluxing agent is not necessary.

"Substantially free of hydroxyl functionality" means the epoxide equivalent weight is at or near the theoretical epoxide equivalent weight (that is, within 5 percent or less of the theoretical epoxide weight) and there is no hydroxyl group inherent in the monomeric form of the epoxide.

"Substantially insoluble" means that when a particulate form (1–10 mil (0.025–0.25 mm)) of the insoluble component is added to a liquid component, an opaque blend is formed which remains unchanged and only goes translucent upon heating of the mixture to a temperature of 80° C. or greater.

"Fluxing agent" means a material that cleans a metal, for example solder, surfaces of oxides.

"Adhesive" means a cured adhesive composition.

"Parts per hundred" means parts per 100 parts by weight of the total amount of epoxy resin, anhydride curing agent, hydroxyl containing compound, and catalyst.

Advantages of the adhesives and adhesive compositions of the invention include processing stability (as measured by gel time), a shelf life of greater than 4 weeks at ambient temperature under a nitrogen atmosphere, a pot life of greater than 8 hours at 80° C. (defined as a doubling of viscosity), minimal outgassing during cure (as measured by thermogravimetric analysis), and high fluxing activity (as measured by solder spread). Additionally, the adhesives and adhesive compositions of the invention do not substantially interfere with the surface tension/self-alignment feature of the solder. It has also been observed that only minimal force for short periods of time is required during placement to provide constructions that yield metallurgically and electrically bonded component during a reflow process with no additional added pressure required.

The preferred adhesive compositions and resulting adhesives of the invention provide a balance of fluxing properties and improved potlife. This balance is achieved by using a combination of purified epoxy resins, less volatile, relatively high molecular weight anhydrides, and hydroxyl containing compounds that are substantially insoluble in the epoxy resin-anhydride mixture at temperatures less than about 80° C. The adhesive compositions of the invention improve potlife and maintain fluxing capability by generating a fluxing agent just prior to the melting point of the solder. The fluxing agent is generated by the reaction of the hydroxyl containing compound (which becomes soluble at an elevated temperature) and the anhydride, neither of which provide fluxing individually. The purified epoxy resins prevent premature gellation and the substantially insoluble hydroxyl containing compound provide improved potlife since the hydroxyl containing compound reacts with the anhydride at temperatures of about 80° C. and above. Anhydrides having low volatility prevent void formation in the adhesive bondline during cure.

The adhesives and adhesive compositions of the invention do not include polyimide oligomers having a molecular weight of up to about 8,000 g/mol (Mn) having a backbone that is unreactive with an epoxy resin as described in U.S. Ser. No. 09/611,450, entitled Polyimide Hybrid Adhesives, filed on Jul. 6, 2000, now U.S. Pat. No. 6,294,259.

DETAILED DESCRIPTION OF THE PREFERRED EMBODIMENT

The adhesives and adhesive compositions of the invention contain one or more epoxy resins. Useful epoxy resins include, for example, substituted or unsubstituted aliphatic, cycloaliphatic, aromatic and/or heterocyclic polyepoxides, such as glycidyl esters, glycidyl ethers, glycidyl-functional amino phenols, glycidyl amines, or epoxidized olefins, and combinations thereof.

Specific examples of epoxy resins useful in the adhesives and adhesive compositions of the present invention include, but are not limited to, bisphenol A-epichlorohydrin epoxy resins, bisphenol F-epichlorohydrin epoxy resins, aliphatic mono glycidyl ethers, aliphatic diglycidyl ethers, diglycidyl-functional amino phenols, aliphatic multifunctional glycidyl ethers, and aliphatic glycidyl esters.

Examples of useful bisphenol A-epichlorohydrin epoxy resins include, but are not limited to, EPON™ Resins 825, 826, and 828, available from Shell Chemical Company, Houston, Tex.; D.E.R.™ 330, 331, and 332, available from Dow Chemical Company, Midland, Mich.; and ARALDITE™ GY 6008, GY 6010, and GY 2600, available from Vantico Inc., Brewster, N.Y.

Examples of useful bisphenol F-epichlorohydrin epoxy resins include, but are not limited to, EPON™ Resin 862, available from Shell Chemical Company, Houston, Tex.; and ARALDITE™ GY 281, GY 282, GY 285, PY 306, and PY 307, available from Vantico Inc., Brewster, N.Y.

Examples of useful mono, di and multifunctional glycidyl ether resins include, but are not limited to, XB 4122, TACTIX 556, TACTIX 742, and ARALDITE 510, available from Vantico Inc., Brewster, N.Y; and EPON™ 1510, HELOXY™ Modifier 107, and HELOXY™ Modifier 48, available from Shell Chemical Company, Houston, Tex.

The epoxy resins are preferably ionically clean in that they are substantially free of ionic species. The epoxy resins are also preferably substantially free of hydroxyl functionality. The epoxy resins may also contain polymeric and/or glass microspheres as described in U.S. Ser. No. 09/402,336, now U.S. Pat. No. 6,288,170, incorporated by reference herein for cured epoxy resins that are removable by the application of heat and methods of making same.

Removal of residual ionic halogens can be accomplished by first reacting the epoxy resin with a base. The base is present in an amount which exceeds the molar equivalent based on the materials comprising hydrolyzable halide. This amount depends on the starting epoxy resin. For example, if no other acids are present, a theoretical amount of base can be used based on the ppm of hydrolyzable halide. In other situations, for example, 100 percent to 200 percent base is required.

The epoxy resin may be combined with a base at room temperature to form a mixture or in other situations, the epoxy resin may be pre-heated. Thus, the heating and agitation step may occur prior to and during the reaction with the base, simultaneously with the base treatment step, or after the base is added to the epoxy resin. This order is dictated by the starting epoxy resin.

The selection of the base depends upon the starting epoxy resin. Examples of suitable bases useful in the process of the present invention include, but are not limited to, hydroxides such as potassium hydroxide in water, sodium hydroxide, and lithium hydroxide, hydrides such as lithium hydride, sodium hydride (optionally in mineral oil), and potassium hydride, alkoxides such as primary, secondary, and tertiary (e.g., potassium t-butoxide in tetrahydrofuran (THF)) alkoxides such as sodium ethoxide, carbonates such as potassium carbonate and sodium carbonate, and quaternary ammonium salts.

Generally, the base strength and the temperature are such that the halohydrin closes to the epoxy and under which the epoxy does not polymerize. For example, in one case for an epichlorohydrin-derived epoxy resin, potassium t-butoxide in THF was suitable at 25° C., but the resin polymerized at 70° C.

The use of non-nucleophilic bases such as sodium hydride are believed to have the advantageous effect of closing the halohydrin without reacting appreciably with other base (hydrolytically) sensitive functionality such as esters. Without being bound by theory, the following is believed to occur:

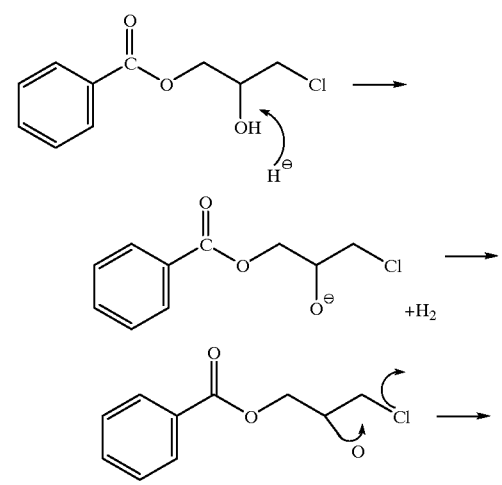

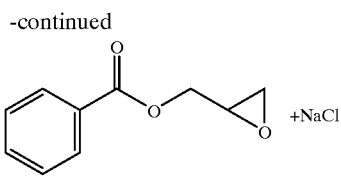

If a non-nucleophilic base is used, the process of the present invention preferably comprises the following steps: (a) distilling an epoxy resin comprising materials containing hydrolyzable halide using molecular distillation to yield an epoxy distillate; and (b) reacting said epoxy distillate with a base wherein said base is present in a quantity which exceeds the molar equivalent based on the materials containing hydrolyzable halide.

The initial distillation step removes moisture along with high molecular weight materials containing hydroxyl functionality. The product can either be neutralized with water and carbon dioxide to remove residual sodium hydride before distillation or can be distilled directly without neutralization.

The mixture is heated to a temperature suitable for reaction of the halohydrin to form the epoxy while agitated. For example, the mixture may be heated using a heat mantel. Generally, the mixture is heated between 20° C. to 200° C. for 1 minute to 12 hours. However, the temperature and time depend upon the starting epoxy resin, base strength and solubility, the catalytic activity of the base towards epoxy polymerization, and commercial viability.

This heating and mixing can occur after the epoxy resin and base are combined, prior to and during the base treatment step, or simultaneously with the addition of the base and base treatment step.

The mixture is usually heated to alter the viscosity which in turn helps the dispersion of the base.

The heated mixture is then neutralized, if required, using carbon dioxide to form a crude product. With the hydrides, this neutralization step may not be required. Optionally, at this point, residual salts may be removed from the crude product by filtration.

Next, the crude product is isolated by molecular distillation to yield the product. For example, a rolled film evaporator or wipe film evaporator may be used. With a rolled film evaporator, the crude product is distributed across a vertical heated surface by an efficient, self-cleaning roller wiper system into a uniform thin film. The evaporated material travels a short distance to an internal condenser. A smaller vacuum is used with low operating temperatures. (See UIC Inc., "Short Path Vacuum Distillation from Laboratory to Production", 1997). With a wipe film evaporator, a wiper is used instead of the self-cleaning roller wiper.

The distillation conditions depend on the boiling point of the crude product.

Noncondensible materials which may be the starting materials, that is, the epoxy resin, are removed during molecular distillation.

The yielded epoxy product has low levels of hydrolyzable halide, that is, from 1 to 100 ppm, preferably less than 10 ppm, more preferably less than 1 ppm.

The yielded product is preferably free of high molecular weight materials. High molecular weight material-free is defined herein as having no dimers and materials having higher molecular weight than the dimer. The epoxide equivalent weight is at or near the theoretical epoxide equivalent weight (that is, within 2 percent, preferably within 1 percent of the theoretical epoxide equivalent weight) and liquid chromatography of the distillant indicates greater than 98 percent monomeric epoxy. These data indicate an epoxy resin that is substantially free of hydroxyl functionality.

The purified epoxy product has a higher cured glass transition temperature than the less pure version which is advantageous. The purified epoxy product is also more predictable due to product consistency. The viscosity is lower than the less pure version of the same epoxy resin. There is no residual base in the epoxy product which is advantageous. Residual base may inhibit cationically cured epoxies. Other low hydrolyzable halide epoxy resins such as EPON™ Resin 1462, available from Shell Chemical Company, which have some residual base are described as having a yellow color (a Gardner Color Scale value of less than 3). The purified epoxy product is colorless. For example, using the Gardner test (ASTM D1544-80), the Gardner Color Scale value is less than 0.1 for EPON™ Resin 828.

The above epoxy purification process can be batch or continuous.

A preferred method of making ionically clean epoxy resins is described in U.S. application Ser. No. 09/454,558, entitled "Process for the Elimination of Materials Containing Hydrolyzable Halides and Other High Molecular Weight Materials from Epihalohydrin Derived Epoxy Resins", filed on Dec. 7, 1999, incorporated by reference herein.

Epoxy resin is present in the adhesives of the invention at a level of from about 10 to 90, preferably from about 20 to about 80, and more preferably from about 30 to about 70 parts per hundred.

The adhesives of the invention contain one or more anhydride curing agents. As used herein, "anhydride" also contemplates mono-, di- and poly-anhydrides. In one embodiment of the present invention, the anhydride functions as a reactant or crosslinking agent for the epoxy resin and also reacts with the hydroxyl containing compound (described below) to form an acid in-situ which functions as a fluxing agent. Useful anhydrides of the invention have low volatility as determined by thermogravimetric analysis using a procedure where the temperature is ramped from ambient to 140° C. at a rate of 90° C./minute, held isothermal for 1 minute, then ramped to a temperature of 225° C. at a rate of 90° C./minute and then held isothermal for 2 minutes, each temperature ramp in air. The anhydride, under these conditions, preferably shows a weight loss of less than 10 percent, more preferably less than 5 percent. Useful anhydrides are also capable of being dissolved into the epoxy resin. "Dissolved in the epoxy resin" means that the blend is translucent after stirring (and heating generally to about 120° C. to about 180° C. depending upon the epoxy resin and anhydride used and the mix ratio). Any aromatic or aliphatic anhydride having low volatility and the solubility described above are useful in the present invention. Specific useful anhydrides include 5-(2,5-dioxotetrahydrofuryl)-3-methyl-3-cyclohexene-1,2-dicarboxylic anhydride, 5,5'-(1,1,3,3-tetramethyl-1,3-disiloxanediyl)bis[hexahydro-4,7-methanoisobenzofuran-1,3-dione], and combinations thereof.

In the case of an adhesive composition of the invention containing epoxy resin and anhydride and in applications where the volatility of the anhydride is not detrimental to the performance of the adhesive, the anhydride may be liquid and more volatile that the anhydrides described above.

Examples of such more volatile anhydrides include methyl-5-norbornene-2,3-dicarboxylic anhydride methylcyclohexene-1,2-dicarboxylic anhydride, methyltetrahydrophthalic anhydride, and combinations thereof. The anhydride is present in the adhesives of the invention at a level of from about 5 to about 80, preferably from about 15 to about 60, and more preferably from about 20 to about 50 parts per hundred.

The adhesives of the invention may contain one or more hydroxyl containing compounds that are substantially insoluble in the epoxy resin at a temperature of less than 80° C. Upon heating of the adhesive composition to a temperature of about 80° C. or greater, the hydroxyl containing compound will dissolve into the epoxy resin and react with the anhydride to form an acid moiety that functions as a fluxing agent. Examples of classes of hydroxyl containing compounds that may be used in the adhesive compositions of the invention include mono-, di-, tri- and poly-alcohols and phenols including bisphenols and combinations thereof with di-functional hydroxy containing compounds being preferred. Useful hydroxyl containing compounds are substantially insoluble in the blend of the epoxy resin and anhydride at temperatures from ambient to less than 80° C., and preferably have a weight loss of less than 30 percent when tested according to the thermogravimetric analysis described above. Specific examples of hydroxyl containing compounds that are useful in the present invention include ethoxylated bisphenol fluorene, hydrogenated bisphenol A, bisphenol Z, bis(2-hydroxyethyl)terephthalate, and 1,12-dodecandiol. Hydroxyl containing compound is present in the adhesive compositions of the invention at a level of from about 1 to about 50, preferably from about 3 to about 30, and more preferably from about 5 to about 15 parts per hundred.

The adhesives of the invention optionally, but preferably, contain one or more catalysts. The function of the catalysts in the adhesives of the invention is to accelerate the reaction between epoxy and anhydride and between the reaction product of the hydroxyl containing compound and the anhydride. Useful catalysts are latent under ambient conditions but are activated to accelerate reactions when heated above a temperature of 80° C. or greater. Classes of useful catalysts include transition metal complexes and organic bases, such as organophosphorous compounds, and amines having the above characteristics are known to those having ordinary skill in the art. Specific examples of useful catalysts include cobalt naphthenate, cobalt (II) acetylacetonate, cobalt (III) acetylacetonate, and copper benzoate. Catalyst is present in the adhesive compositions of the invention at a level of from about 0.05 to about 10, preferably from about 0.3 to about 5, more preferably from about 0.5 to about 2 parts per hundred.

The adhesive compositions of the invention may contain additional additives that are known to those skilled in the art. Such classes of additives include but are not limited to fillers such as silica; glass and polymeric microballoons; expandable polymeric microballoons; coupling agents, for example, silane coupling agents; pigments; thixotropic agents; toughening agents; cure indicating materials; and combinations thereof. Additives are present in the compositions of the invention at a level to effect the desired result.

Addition of a silane coupling agent is optional in the preparation of cured compositions of the invention. Preferably the silane coupling agent is added to the adhesive composition when the substrate surface is glass, and oxide or any other surface that would benefit from the addition of a silane coupling agent. When present, a silane coupling agent contains a functional group that can react with the epoxy resin, e.g., 3-glycidoxypropyltrimethoxysilane.

Generally, the epoxy resin and anhydride are mixed together with stirring, preferably under an inert atmosphere, with heat until the anhydride is dissolved. The temperature at which the mixture is heated is dependent upon the structure and mix ratio of the epoxy resin and the anhydride and generally ranges from about 120° C. to about 180° C. for solid anhydrides. However, in the case of a liquid and non-volatile anhydride, perhaps no additional heating would be necessary. After the epoxy resin and anhydride are blended to form a non-opaque mixture and cooled to about 80° C. or below, the hydroxyl containing compound and catalyst are blended into the epoxy resin-anhydride mixture. Solid hydroxyl containing compounds are preferably milled and sieved prior to being mixed into the composition.

The adhesive compositions of the invention may be cured by exposure to a temperature profile used to reflow eutectic solder, namely ambient temperature ramped to 150° C. at 90° C./minute, held isothermal for approximately 1 minute, then ramped to about 220° C.-250° C. at 90°C./minute. A post-cure at 150° C.-170° C. for about 0.5 to about 2 hours may be used to complete the cure.

The adhesive compositions and resulting adhesives are useful to attach solder bumped flip-chips to a substrate and as an underfill adhesive or encapsulant for surface mounted components in general so to provide environmental protection for the surface mounted components. For example, the adhesive composition of the invention would be applied to the substrate, the chip placed onto the adhesive composition with solder bumps down, and then the component would be heated so to reflow the solder.

EXAMPLES

Unless otherwise stated, all amounts are by weight.

In the Examples below, the following abbreviations, materials, and equipment used are defined as follows:

"° C." means degrees Celsius;

"4,8-Bis(hydroxymethyl)tricyclo[$5.2.1.0^{2,6}$]dodecane" was available from Aldrich Chemical Company of Milwaukee, Wis.;

"Bisphenol A" (BPA) was available from Aldrich Chemical Company;

"Bisphenol Z" (BPZ) was available from Aldrich Chemical Company;

"Cobalt naphthenate" was available as a 53 percent by weight solution in mineral spirits from Strem Chemicals Incorporated, Newburyport, Mass.;

"1,4-Cyclohexanedimethanol" (CHDM) was available from Aldrich Chemical Company;

"1,6-Dihydroxynaphthalene" was available from Aldrich Chemical Company;

"1,7-Dihydroxynaphthalene" was available from Aldrich Chemical Company;

"2,3-Dihydroxynaphthalene" was available from Aldrich Chemical Company;

"2,6-Dihydroxynaphthalene" was available from Aldrich Chemical Company;

"5-(2,5-Dioxotetrahydrofuryl)-3-methyl-3-cyclohexene-1,2-dicarboxylic anhydride" (THFDA) was available from Chriskev Company, Inc. of Shawnee Mission, Kans.;

"Die" is an integrated circuit on a silicon chip having a Si3N4 passivation on the die surface;

"Die Shear Test" was performed using a Dage 2400P die shear tester available from Dage, Aylesbury, Bucks, England. The force to remove the die was measured and the shear strength was calculated in $kg/mm^2$;

"Dynamic Mechanical Analysis" (DMA) was performed using a RHEOMETRICS RDA2 thermal analyzer, and was available from Rheometric Scientific, Incorporated of Piscataway, N.J., equipped with 25-millimeter parallel plates. For testing, each sample was placed between the plates then placed in the fixture at 80° C. Testing was performed at one Hertz and 1.0 percent strain for 12 hours;

"Ethoxylated bisphenol fluorene" (BPEF) was available from Osaka Gas Chemicals Co. Ltd, Osaka, Japan;

"EPON RESIN 828" is a trade designation for a bisphenol A/epichlorohydrin-based epoxy resin, and was available from Shell Chemical Company of Houston, Tex.;

"EPOXY RESEARCH RESIN RSL-1462" is a trade designation for a bisphenol A/epichlorohydrin-based epoxy resin having residual levels of epichlorohydrin of less than 1 part per million by weight, and was available from Shell Chemical Company of Houston, Tex.;

"ERL 4221E RESIN" is a trade designation for a cycloaliphatic epoxy resin, and was available from Union Carbide Chemicals and Plastics Company, Danbury, Conn.;

"FR4" is a glass/epoxy laminate;

"5,5'-(1,1,3,3-Tetramethyl-1,3-disiloxanediyl)bis[hexahydro-4,7-methanoisobenzofuran-1,3-dione]" (DiSian) was available from General Electric Plastics, Owing Mills, Md.;

"4,4'-(1-Methylethylidene) bis-cyclohexanol" (HBPA) was available from Milliken Chemicals, Inman, S.C.;

"Methyl-5-norbornene-2,3-dicarboxylic anhydride" was available from Aldrich Chemical Company;

"Methylphthalic anhydride" was available from Aldrich Chemical Company;

"MICRO MILL" mill refers to a MICRO MILL, a milling apparatus, and was available from Bel Art Products, Incorporated, Pequannock, N.J.;

"Polyethylene glycol 2000" was available from Aldrich Chemical Company;

"Polyethylene glycol 600" was available from Aldrich Chemical Company;

"Polyethylene glycol 260" was available from Aldrich Chemical Company;

"Purified EPON RESIN 828" was prepared according to the following procedure:

A three-neck, round-bottom flask equipped with a mechanical stirrer, nitrogen inlet, and temperature probe was used. First, 500 parts of EPON RESIN 828 (689 parts per million by weight hydrolyzable chloride) was added to the flask and heated to 70° C. A premix of 1.5 parts of 85 percent potassium hydroxide in 1.5 parts of water was added to the EPON RESIN 828, with mixing. The mixture was heated for 4 hours, after which dry ice was added and mixing continued for 30 minutes. The mixture was then cooled to room temperature, yielding a crude product. The crude product was distilled on a rolled film evaporator at 185° C. and 0.001 Torr to give 224 parts of a colorless material. Analysis showed that hydrolyzable chloride in the material was reduced to 2.2 parts per million by weight as determined according to ASTM Method D 1726-90, "Standard Test Methods for Hydrolyzable Chloride Content of Liquid Epoxy Resins", (Test Method B);

"SPEEDMIXER" mixer refers to a SPEEDMIXER DAC 150 FV, a variable speed mixing apparatus, and was available from FlackTek, Incorporated, Landrum, S.C.; and "3-Ureidopropyltriethoxysilane" is a silane coupling agent and was available from Sivento, Inc, Ridgefield Park, N.J.

Examples 1–4 and Comparative Examples C-1 to C-5

Stock solutions of Purified EPON RESIN 828 and anhydride were prepared by heating the components with stirring under a purge of nitrogen in 250 ml reaction flasks submerged in a 160° C. oil bath until the anhydride was dissolved (typically 0.5–1 hours). The blend was poured into 70-mm cups designed for use in a SPEEDMIXER mixer.

The solid hydroxyl containing compounds were milled using a MICRO MILL mill and sieved using wire mesh screens (0.0021 inch (0.053 mm) openings). The liquid hydroxyl containing compounds were added neat.

The various hydroxyl containing compounds and cobalt naphthenate catalyst were added to the cups containing the epoxy resin/anhydride blends prepared above, then dispersed therein using the SPEEDMIXER mixer.

The components and amounts are given below:

| | |
|---|---|
| Example 1 | Purified EPON 828 - 45.2 g |
| | 5-(2,5-Dioxotetrahydrofuryl)-3-methyl-3-cyclohexen-1,2-dicarboxylic anhydride (THFDA) - 29.8 g |
| | 4,4'-(1-Methylethylidene) bis-cyclohexanol (HBPA) - 8.9 g |
| | Cobalt naphthenate - 0.5 g |
| Example 2 | Purified EPON 828 - 45.2 g |
| | THFDA - 29.8 g |
| | Ethoxylated Bisphenol Fluorene (BPEF) - 16.4 g |
| | Cobalt naphthenate - 0.5 g |
| Example 3 | Purified EPON 828 - 31.8 g |
| | 5,5'-(1,1,3,3-Tetramethyl-1,3-disiloxanediyl)bis[hexahydro-4,7-methanoisobenzofuran-1,3-dione] (DiSian) - 37.2 g |
| | BPEF- 11.7 g |
| | Cobalt naphthenate - 0.4 g |
| Example 4: | Purified EPON 828 - 45.2 g |
| | THFDA - 29.8 g |
| | HBPA-8.9 g |
| | 3-Ureidopropyltriethoxysilane - 0.9 g |
| | Cobalt naphthenate - 0.5 g |
| Comparative Example C-1 | Purified EPON 828 - 45.2 g |
| | THFDA - 29.8 g |
| | 4,8-Bis(hydroxymethyl)tricyclo[$5.2.1.0^{2,6}$]dodecane - 7.4 g |
| | Cobalt naphthenate - 0.5 g |
| Comparative Example C-2 | EPON 828 - 54.7 g |
| | THFDA - 33.0 g |
| | HBPA - 9.8 g |
| | Cobalt naphthenate - 0.5 g |
| Comparative Example C-3 | RSL EPON 1462 - 54.7 g |
| | THFDA - 33.0 g |
| | HBPA - 9.8 g |
| | Cobalt naphthenate - 0.5 g |
| Comparative Example C-4 | Purified EPON 828 - 9.6 g |
| | Methyl-5-norbornene-2,3-dicarboxylic anhydride - 1.9 g |
| | HBPA- 1.9 g |
| | Cobalt naphthenate - 0.2 g |
| Comparative Example C-5 | Purified EPON 828 - 8.9 g |
| | Methylphthalic anhydride - 7.9 g |
| | BPEF - 3.2 g |
| | Cobalt naphthenate - 0.2 g |

Examples 1–3, Comparative Example C-4, and Comparative Example C-5 were tested for outgassing as determined by percent weight loss by Thermal Gravimetric Analysis (TGA) using a TGA 2950 Thermogravimetric Analyzer, available from TA Instruments, New Castle, Del. Each sample was heated from ambient temperature to 140° C. at a rate of 90° C. per minute, held at 140° C. for 1 minute, then heated to 225° C. at the rate of 90° C. per minute, and held at 225° C. for 2 minutes. This profile mimics the temperature conditions in a solder reflow oven.

The percent weight loss is given in Table I.

TABLE I

| Example No. | Percent Weight Loss |
| --- | --- |
| 1 | 1.31 |
| 2 | 1.21 |
| 3 | 0.97 |
| C-4 | 11.23 |
| C-5 | 14.67 |

Example 5

This Example illustrates the effect on the complex viscosity of a composition upon heating when a solubilized hydroxyl containing compound is an added liquid or is present in the form of hydroxyl groups on the epoxy resin.

The compositions of Examples 1, Comparative Example C-1, Comparative Example C-2, and Comparative Example C-3 were prepared as described above. Example 1 contained a solid hydroxyl containing compound. Comparative Example C-1 contained a liquid hydroxyl containing compound. Comparative Examples C-2 and C-3 contained liquid epoxy resins having hydroxyl functionality.

The complex viscosity of these blends was determined by Dynamic Mechanical Analysis (DMA). DMA was performed using a RHEOMETRICS RDA2 thermal analyzer available from Rheometric Scientific, Incorporated of Piscataway, N.J., equipped with 25-millimeter parallel plates.

For testing, each sample was placed between the plates then placed in the fixture at 80° C. Testing was performed at one Hertz and 1.0 percent strain for 12 hours.

The composition tested and the time required for the complex viscosity of each sample to double in value are given below in Table II.

TABLE II

| Example No. | Composition | Time (sec) |
| --- | --- | --- |
| 5a | Ex. 1 | 12,800 |
| 5b | Ex.C-2 | 5,100 |
| 5c | Ex.C-3 | 5,900 |
| 5d | Ex.C-1 | 4,900 |

Example 6

This Example illustrates the effect of various component combinations on fluxing properties.

About 0.2 g of 1:1 blends by weight of purified EPON 828 and a hydroxyl containing compound were prepared and placed on a one inch (25.4 mm) wide×two inch (50.8 mm) long×0.0155 inch (0.39 mm) thick copper test piece. Eight 0.025 inch (0.635 mm) diameter eutectic solder balls (63:37 by weight Sn/Pb) were placed in the blend and pressed down gently to make contact with the copper surface. The copper test piece was placed on a hot plate set at 220° C. After 60 seconds, the number of solder balls that spread was recorded.

About 0.2 g of a blend of purified EPON 828 with THFDA (0.85 equivalents anhydride per equivalents epoxide) was placed on a copper test piece and eight Sn/Pb solder balls were placed in the blend and pressed down gently to make contact with the copper surface. The copper test piece was placed on a hot plate set at 220° C. After 60 seconds, the number of solder balls that spread was recorded.

A duplicate copper test piece was prepared as above using the blend of purified EPON 828 with THFDA (0.85 equivalents anhydride per equivalents epoxide) and was placed on a hot plate set at 220° C. Immediately, a small portion of a hydroxyl containing was placed directly on the purified EPON 828/THFDA blend and the solder balls on the hot plate. As above, after 60 seconds, the number of solder balls that spread was again recorded.

The hydroxyl containing compounds used and the ratio of the number of solder balls that spread to the number of solder balls tested are shown in Table III.

TABLE III

| | Number of Solder Balls Spread/Number of Solder Balls | | |
| --- | --- | --- | --- |
| Hydroxyl-Containing Compound | Blend of Purified EPON 828/ Hydroxyl-Containing Compound | Blend of Purified EPON 828/ THFDA | Hydroxyl-containing Compound Added to Blend of Purified EPON 828/ THFDA |
| 1,6-Dihydroxynaphthalene | 0/8 | 0/8 | 8/8 |
| 1,7-Dihydroxynaphthalene | 0/8 | 0/8 | 7/8 |
| 2,3-Dihydroxynaphthalene | 0/8 | 0/8 | 7/8 |
| 2,6-Dihydroxynaphthalene | 0/8 | 0/8 | 7/8 |
| Bisphenol A | 0/8 | 0/8 | 8/8 |
| Bisphenol Z | 0/8 | 0/8 | 8/8 |
| Polyethylene glycol-2000 | 0/8 | 0/8 | 8/8 |
| Polyethylene glycol-600 | 0/8 | 0/8 | 7/8 |
| Polyethylene glycol-260 | 0/8 | 0/8 | 8/8 |
| CHDM | 0/8 | 0/8 | 8/8 |
| HBPA | 0/8 | 1/8 | 8/8 |
| BPEF | 0/8 | 0/8 | 8/8 |

It can be seen that neither the combination of the purified EPON 828/THFDA alone or the purified EPON 828/hydroxyl-containing compound alone allowed the solder to spread on the copper test piece. However, when the hydroxyl-containing compound and the THFDA were both present with the purified EPON 828, the combination of hydroxyl-containing compound and THFDA allowed the solder to spread. This demonstrates the fluxing capability of the current invention and it illustrates that the components, added individually to the epoxy resin, do not act as fluxing agents.

Example 7

This Example illustrates the effect on gel time of various epoxy resins in combination with THFDA.

Blends of five different epoxy resins and THFDA were prepared with one equivalent of anhydride per equivalent of epoxide, based on the reported or calculated equivalent weights of the epoxy resins. The THFDA was added as a solid, and clear solutions of THFDA in the epoxy resins were observed after several minutes at the testing temperature of 177° C.

The gel time of the epoxy resin/THFDA blend was determined using a gel point tester (Gardco "Hot Pot" Gel Timer, Paul N. Gardner Company, Pompano Beach, Fla.) set at a temperature of 177° C.

The amount and epoxy resin used, the amount of THFDA used, and the gel time results are shown in Table IV.

TABLE IV

| Epoxy Resin | Amount of Epoxy (g) | Amount of THFDA (g) | Gel Time |
|---|---|---|---|
| Purified EPON 828 | 50.0 | 38.86 | 118 min. 40 sec. |
| EPON 828 | 50.0 | 35.71 | 88 min. 58 sec. |
| RSL 1462 | 50.0 | 35.71 | 97 min. |
| EPON 825 | 50.0 | 37.75 | 105 min. 25 sec. |
| ERL 4221E | 50.0 | 41.60 | 14 min. 10 sec. |

The data shows that epoxy resins EPON 828, RSL 1462, and EPON 825, which have hydroxyl groups in the molecule, have shorter gel times than the purified EPON 828 resin. This leads to a processing advantage for the non-hydroxyl containing purified EPON 828 glycidyl epoxy resin. Even though the cycloaliphatic epoxy resin ERL 4221E contains no hydroxyl moieties, it is far more sensitive to acid and is more susceptible to gelation.

Shear strength of the adhesives of Example 1 and Example 4 were conducted at ambient conditions and after 1 week of exposure to 85° C./85 percent RH using die bonded to a FR4 circuit board. Each die had a $Si_3N_4$ passivation on the die surface.

FR4 circuit boards were cleaned prior to bonding by wiping them with heptane then with acetone (spectral grade). The FR4 circuit boards were then dried for 15 minutes at 110° C. in a forced-air oven and then baked out for 10 minutes at 220° C. in a forced-air oven that was purged with nitrogen gas. The FR4 circuit boards and die were then exposed to oxygen plasma (Harrick Scientific PDC-32G) for 5 minutes on high setting to remove any residual organic impurities. The FR4 circuit boards and the die were bonded within 30 minutes of the plasma treatment. A dot of adhesive about 0.7 mm in diameter was used to bond each 3.5 mm square die to the FR4 board. Each die had high melt alloy (InPb) bumps which provided a uniform gap/stand-off of ~4 mil (0.1 mm). Four (4) die were bonded onto a single board. Each die was placed in such a way that the InPb bumps made contact with the FR4 circuit board. The adhesives were cured at 200° C. for 30 minutes in a forced-air oven.

The die shear strengths of Example 1 and Example 4 were each about 5.5 kg/mm² at ambient conditions. After 1 week of exposure to 85° C./85 percent RH, the die shear strength of Example 1 was too low to be measured (some of the die fell off of the substrate before testing) and the die shear strength of Example 4 was about 4.0 kg/mm².

|  | Shear Strength 'initial | Shear Strength '85/85 1 wk |
|---|---|---|
| Example 1 | 5.5 kg/mm² | 0 kg/mm² |
| Example 4 | 5.5 kg/mm² | 4.0 kg/mm² |

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims as set forth herein as follows.

What is claimed is:

1. A one-part, thermally curable, adhesive composition comprising:

epoxy resin substantially free of hydroxyl functionality;

anhydride curing agent, wherein the anhydride has a weight loss of less than 10 percent as determined by thermogravimetric analysis wherein the temperature is ramped from ambient to 140° C. at a rate of 90° C./minute, held isothermal for 1 minute, then ramped to a temperature of 225° C. at a rate of 90° C./minute and then held isothermal for 2 minutes;

hydroxyl containing compound that is substantially insoluble in the epoxy resin at a temperature of less than 80° C.; and optionally, catalyst.

2. The adhesive composition of claim 1 wherein the epoxy resin is selected from the group consisting of glycidyl esters, glycidyl ethers, glycidyl ethers of amino phenols, glycidyl amines, epoxidized olefins, and combinations thereof.

3. The adhesive composition of claim 1 wherein the anhydride curing agent is selected from the group consisting of 5-(2,5-dioxotetrahydrofuryl)-3-methyl-3-cyclohexene-1, 2-dicarboxylic anhydride, 5,5'-(1,1,3,3-tetramethyl-1,3-disiloxanediyl)bis[hexahydro-4,7-methanoisobenzofuran-1, 3-dione], and combinations thereof.

4. The adhesive composition of claim 1 wherein the hydroxyl containing compound is selected from the group consisting of mono-, di-, tri- and poly-alcohols and phenols, and combinations thereof.

5. The adhesive composition of claim 1 wherein the catalyst is present.

6. The adhesive composition of claim 1 wherein the epoxy resin is present in an amount of from about 10 to 90 parts per hundred.

7. The adhesive composition of claim 1 wherein the anhydride curing agent is present in an amount of from about 5 to about 80 parts per hundred.

8. The adhesive composition of claim 1 wherein the hydroxyl containing compound is present in an amount of from about 1 to about 50 parts per hundred.

9. The adhesive composition of claim 5 wherein the catalyst is selected from the group consisting of cobalt naphthenate, cobalt (II) acetylacetonate, cobalt (III) acetylacetonate, copper benzoate, and combinations thereof.

10. The adhesive composition of claim 5 wherein the catalyst is present in an amount of from about 0.05 to about 10 parts per hundred.

11. The adhesive composition of claim 1 wherein the composition has pot life of greater than 3.5 hours at a temperature of 80° C.

12. The adhesive composition of claim 1 wherein the anhydride curing agent has a weight loss of less than 5 percent as determined by thermogravimetric analysis wherein the temperature is ramped from ambient to 140° C. at a rate of 90° C./minute, held isothermal for 1 minute, then ramped to a temperature of 225° C. at a rate of 90° C./minute and then held isothermal for 2 minutes.

13. The adhesive composition of claim 1 wherein the anhydride curing agent is a solid at ambient temperature.

14. The cured adhesive resulting from the reaction of the adhesive composition of claim 1.

15. A method of bonding an electrical component assembly comprising the steps of:

providing an electrical component having a plurality of electrical terminations, each termination including a solder bump;

providing a component carrying substrate having a plurality of electrical terminations corresponding to the terminations of the electrical component;

providing a sufficient amount of an adhesive composition of claim 1 onto the substrate;

contacting the electrical component with the adhesive composition; and curing the adhesive composition.

16. An electrical component assembly comprising:

an electrical component having a plurality of electrical terminations, each termination including a solder bump;

a component carrying substrate having a plurality of electrical terminations corresponding to the terminations of the electrical component; and an adhesive disposed between and bonding the electrical component and the substrate together, the solder bumps being reflowed and electrically connecting the electrical component to the substrate, the adhesive comprising the reaction product of:

an adhesive composition comprising:

epoxy resin substantially free of hydroxyl functionality;

anhydride curing agent, wherein the anhydride has a weight loss of less than 10 percent as determined by thermogravimetric analysis wherein the temperature is ramped from ambient to 140° C. at a rate of 90° C./minute, held isothermal for 1 minute, then ramped to a temperature of 225° C. at a rate of 90° C./minute and then held isothermal for 2 minutes;

hydroxyl containing compound that is substantially insoluble in the epoxy resin at a temperature of less than 80° C.; and optionally, catalyst.

17. A one-part, thermally curable, adhesive composition comprising:

epoxy resin substantially free of hydroxyl functionality;

anhydride curing agent, wherein the anhydride has a weight loss of less than 5 percent as determined by thermogravimetric analysis wherein the temperature is ramped from ambient to 140° C. at a rate of 90° C./minute, held isothermal for 1 minute, then ramped to a temperature of 225° C. at a rate of 90° C./minute and then held isothermal for 2 minutes;

hydroxyl containing compound that is substantially insoluble in the epoxy resin at a temperature of less than 80° C.;

coupling agent; and optionally, catalyst.

18. The adhesive composition of claim 17 wherein the coupling agent is a silane coupling agent.

19. The adhesive composition of claim 17 wherein the anhydride curing agent is selected from the group consisting of 5-(2,5-dioxotetrahydrofuryl)-3-methyl-3-cyclohexene-1,2-dicarboxylic anhydride, 5,5'-(1,1,3,3-tetramethyl-1,3-disiloxanediyl)bis[hexahydro-4,7-methanoisobenzofuran-1,3-dione], and combinations thereof.

20. The adhesive composition of claim 17 wherein the hydroxyl containing compound is selected from the group consisting of mono-, di-, tri- and poly-alcohols and phenols, and combinations thereof.

21. The adhesive composition of claim 17 wherein the catalyst is present.

22. The adhesive composition of claim 17 wherein the epoxy resin is present in an amount of from about 10 to 90 parts per hundred.

23. The adhesive composition of claim 17 wherein the anhydride curing agent is present in an amount of from about 5 to about 80 parts per hundred.

24. The adhesive composition of claim 17 wherein the hydroxyl containing compound is present in an amount of from about 1 to about 50 parts per hundred.

25. The adhesive composition of claim 21 wherein the catalyst is selected from the group consisting of cobalt naphthenate, cobalt (II) acetylacetonate, cobalt (III) acetonate, copper benzoate, and combinations thereof.

26. The adhesive composition of claim 21 wherein the catalyst is present in an amount of from about 0.05 to about 10 parts per hundred.

27. The adhesive composition of claim 17 wherein the composition has pot life of greater than 3.5 hours at a temperature of 80° C.

* * * * *

UNITED STATES PATENT AND TRADEMARK OFFICE
CERTIFICATE OF CORRECTION

PATENT NO. : 6,528,169 B2  Page 1 of 1
DATED : March 4, 2003
INVENTOR(S) : Charles Scott B.

It is certified that error appears in the above-identified patent and that said Letters Patent is hereby corrected as shown below:

<u>Title page,</u>
Item [56], References Cited, OTHER PUBLICATIONS, "One-Conponent" should read -- One-Component --

<u>Column 3,</u>
Line 32, "EMBODIMENT" should read -- EMBODIMENTS --

<u>Column 6,</u>
Line 67, "that" should read -- than --

<u>Column 7,</u>
Line 19, "hydroxy" should read -- hydroxyl --

<u>Column 8,</u>
Line 63, "Si3N4" should read -- $Si_3N_4$ --

<u>Column 10,</u>
Example 1, "5-(2,5-Dioxotetrahydrofuryl)-3-methyl-3-cyclohexen-1,2-dicarboxylic anhydride (THFDA) – 29.8 g" should read -- 5-(2,5-Dioxotetrahydrofuryl)-3-methyl-3-cyclohexene-1,2-dicarboxylic anhydride (THFDA) – 29.8 g --
Comparative Example C-4, "Methyl-5-norbornene-2.3-dicarboxylic anhydride - 1.9 g" should read -- Methyl-5-norbornene-2,3-dicarboxylic anhydride - 1.9 g --

<u>Column 12,</u>
Line 5, after the word "containing" insert -- compound --

Signed and Sealed this

Twentieth Day of January, 2004

JON W. DUDAS
*Acting Director of the United States Patent and Trademark Office*